US006633995B1

(12) United States Patent
Nam

(10) Patent No.: US 6,633,995 B1
(45) Date of Patent: Oct. 14, 2003

(54) SYSTEM FOR GENERATING N PIPELINE CONTROL SIGNALS BY DELAYING AT LEAST ONE CONTROL SIGNAL CORRESPONDING TO A SUBSEQUENT DATA PATH CIRCUIT

(75) Inventor: Kyung Woo Nam, Seoul (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 0 days.

(21) Appl. No.: 09/522,310

(22) Filed: Mar. 9, 2000

(30) Foreign Application Priority Data

Sep. 10, 1999 (KR) .............................. 99-38613

(51) Int. Cl.[7] .............................. G06F 1/04; G06F 1/12
(52) U.S. Cl. ..................... 713/600; 713/400; 713/401; 713/500; 713/601
(58) Field of Search ................. 713/600, 601, 713/400, 401, 500

(56) References Cited

U.S. PATENT DOCUMENTS 5,488,325 A * 1/1996 Sato et al. .................... 326/93
6,055,210 A * 4/2000 Setogawa ............... 365/189.04
6,243,797 B1 * 6/2001 Merritt ....................... 711/100
6,363,465 B1 * 3/2002 Toda ..................... 365/189.04

* cited by examiner

Primary Examiner—Thomas Lee
Assistant Examiner—Michael Nieves
(74) Attorney, Agent, or Firm—Harness, Dickey & Pierce, P.L.C.

(57) ABSTRACT

A high-speed pipeline device includes n data path circuits connected in cascade between an input terminal and an output terminal. N data passing circuits have transmission times {T1, . . . , Tn} each less than a period P of a reference clock signal, at least one of the transmission times differing from another. N pipe registers connect to the input terminals of the data path circuits to latch data passed from a previous stage or the input terminal. A control signal generating circuit produces n pipeline control signals in response to the reference clock signal. N−1 of the pipeline control signals are generated in cascade from preceding pipeline control signals, and an (n)th pipeline control signal is generated directly from the reference clock signal. The control signal generating circuit provides the n pipeline control signals to the n pipe register, so that the total transmission time from the input terminals to the output terminals is minimal. Accordingly, the device can output the valid data within the shortest time by generating pipeline control signals of each stage with a minimum margin for possible changes of a temperature and power supply voltage.

13 Claims, 13 Drawing Sheets

SYSTEM FOR GENERATING N PIPELINE CONTROL SIGNALS BY DELAYING AT LEAST ONE CONTROL SIGNAL CORRESPONDING TO A SUBSEQUENT DATA PATH CIRCUIT

BACKGROUND OF THE INVENTION

1. Field of the Invention

The present invention relates to data pipeline devices and to methods and circuits for generating control signals for data pipelines.

2. Description of the Prior Art

Synchronous Dynamic Random Access Memory (SDRAM) devices commonly include a data pipeline that a plurality of registers divides into stages. The latency or total transmission time of the data pipeline typically controls the access time of the SDRAM. Accordingly, the access time depends on the timing of pipeline control signals that operate the pipeline registers. In the conventional structure, an internal pipeline control signal generator generates the pipeline control signals from a reference clock signal. Typically, the data pipeline cannot be divided into stages having equal transmission times. Accordingly, the reference clock and the pipeline control signals have a period that is longer than the longest transmission time of any stage in the data pipeline.

The pipeline control signal generator generates the pipeline control signals via delay circuits, each having a different delay time. The delay time of each delay circuit includes a margin for variations in the timing of pipeline control signals. The margin accounts for expected variations in operating temperature and power supply voltage. Further, the margin at each stage is an accumulation of the margins for previous stages because each of the following stages of the data pipeline must accommodate what came before. The accumulated margins increase the latency of the data pipeline and reduce performance in applications such as SDRAM.

SUMMARY OF THE INVENTION

An aspect of the present invention is to provide high-speed pipeline devices and methods and circuits for generating control signals for data pipelines. In particular, embodiments of the present invention can minimize the required margins in multi-phase clock signals by generating the multi-phase clock signals in cascade.

According to the above aspect, a device in accordance with an exemplary embodiment of the present invention has n data pipeline stages with respective transmission times (T1, ..., Tn). Each transmission time T1, ..., Tn is shorter than the period P of a reference clock signal. At least one of the transmission times differs from another of the transmission times. The device includes n (n is a natural number) data path circuits or stages, n registers, and a control signal generating circuit. The data path circuits are connected in cascade between an input terminal and an output terminal. The registers connect to input terminals of respective data path circuits and latch data passed from a previous stage or the input terminal. The control signal generating circuit generates a first pipeline control signal in response to the reference clock signal, and other pipeline control signals in cascade from other pipeline control signals. The control signal generating circuit provides the n pipe registers with the n pipeline control signals. Accordingly, the total transmission time of data from the input terminal to the output terminal is about equal to the sum of the transmission times.

In one embodiment of the present invention, the control signal generating circuit includes a first pulse generator and a second pulse generator. The first pulse generator generates an (n)th pipeline control signal that is delayed relative to the reference clock signal, and the second pulse generator generates an (n−1)th pipeline control signal by delaying the (n)th pipeline control. signal. The second pulse generator typically has an associated delay circuit that controls the delay of the (n−1)th pipeline control signal. Additional pulse generators and delay circuits can be connected in a descending series and in cascade to generate further pipeline control signals by delaying other pipeline control signals.

According to another embodiment of the present invention, the control signal generating circuit includes a first pulse generator that inputs the reference clock signal and produces an (n)th pipeline control signal having pulses with a pulse width w1. A second pulse generator produces an (n−1)th pipeline control signal having pulses with a pulse width w2 in response to trailing edges of active regions of the (n)th pipeline control signal.

A method according to an embodiment of the present invention includes generating a pipeline control signal having pulses delayed relative to transitions in a reference signal and generating another pipeline control signal by delaying the other pipeline control signal. The method may further include generating a plurality of pipeline control signals, wherein each pipeline control signal is generated by delaying another pipeline control signal. Active regions of each pipeline control signal can be synchronized with either the leading or trailing edges of the active regions of another of the control signals.

DETAILED DESCRIPTION OF THE INVENTION

Figure 1:
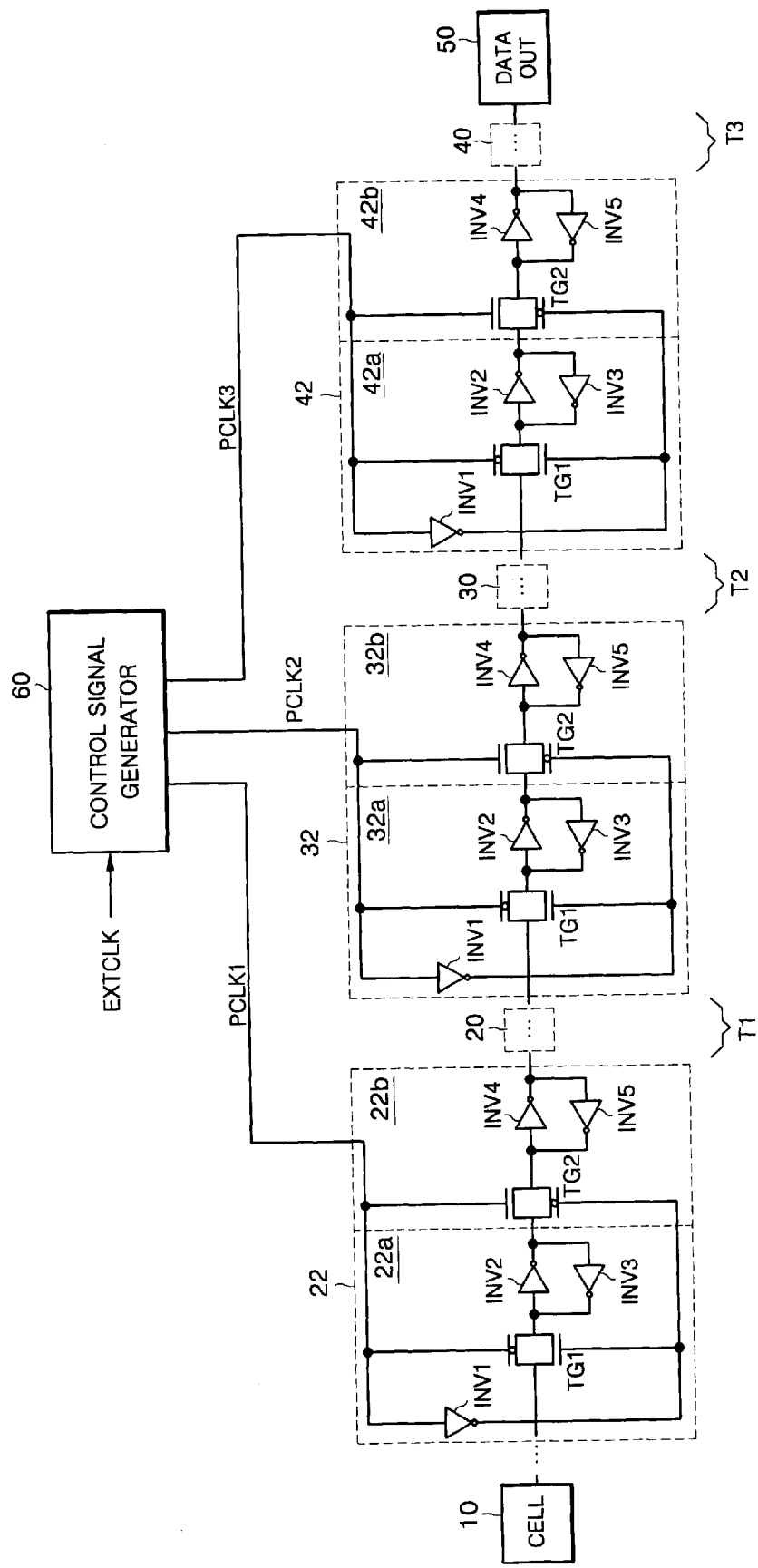
FIG. 1 is a block diagram illustrating a three-stage pipeline device with pipe registers that include input and output latches.

FIG. 1 shows a pipeline device that includes a three-stage data pipeline between an input terminal (a memory cell 10) and an output terminal 50. In the exemplary embodiment shown, the pipeline is in an SDRAM, and the input terminal connects to and receives a data signal from a memory cell 10. The output terminal provides an output data signal after processing through the data pipeline. Pipe registers 22, 32, and 42 are at input portions of the associated data paths or stages 20, 30, and 40. Each data path 20, 30, or 40 contains logic or transmission lines that processes or transmit an input data signal from the associated pipe registers 22, 32, or 42. When the input data signal changes, the output data signal from the data paths 20, 30, or 40 becomes valid after a transmission time T1, T2, or T3 that depends on the logic in the data path or the length of the transmission lines.

The pipe registers 22, 32, and 42 include input latches 22a, 32a, and 42a and output latches 22b, 32b, and 42b, respectively. Each of input latches 22a, 32a, and 42a includes inverters INV1 to INV3 and a transfer gate TG1. Each of output latches 22b, 32b, and 42b includes inverters INV4 and INV5 and a transfer gate TG2.

The pipe registers 22, 32, and 42 receive respective pipeline control signals (also referred to herein as clock signals) PCLK1, PCLK2, and PCLK3. At falling edges of the corresponding clock signal PCLK1, PCLK2, or PCLK3, each transfer gate TG1 turns on, and each transfer gate TG2 turns off. Accordingly, a data signal from a previous stage or the memory cell 10 pass through the transfer gate TG1 and is inverted by the inverter INV2, but inverters INV4 and INV5 maintain and provide a previously latched output signal to the corresponding data path 20, 30, or 40. At rising edges of the corresponding clock signal PCLK1, PCLK2, or PCLK3, the transfer gate TG1 turns off, and inverters INV2 and INV3 latch and maintain the new input data value and provide to the transfer gate TG2 an inverted data signal representing the new data value. The transfer gate TG2 turns on at the rising edges of the corresponding clock signal so that the output latch 22b, 32b, or 42b inverts the data signal from the input latch 22a, 32a, or 42a and outputs the new data signal to the data path 20, 30, or 40.

Figure 2:
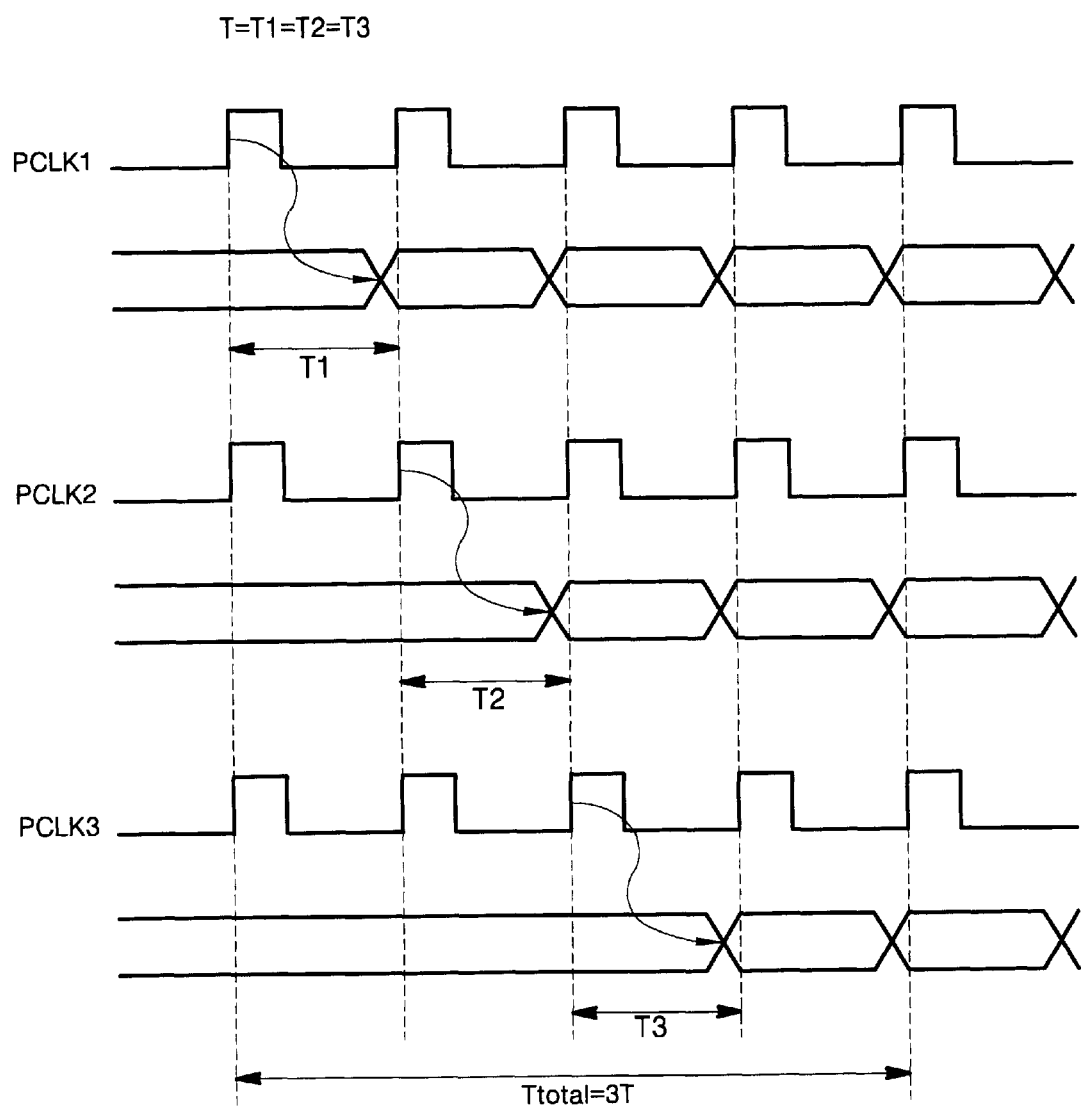
FIG. 2 is a timing diagram illustrating operation of the pipeline device of FIG. 1 when each stage of the pipeline has the same transmission time.

FIG. 2 illustrates the timing of clock signals PCLK1, PCLK2, and PCLK3 and the output data signals from the data paths 20, 30, and 40 when the transmission times T1, T2, and T3 of the respective data paths 20, 30, and 40 are all the same (T=T1=T2=T3). In this case, the latency of the pipeline device (i.e., the time between data output from memory cell 10 and the earliest valid data at the output terminal 50) is 3T.

Figure 3:
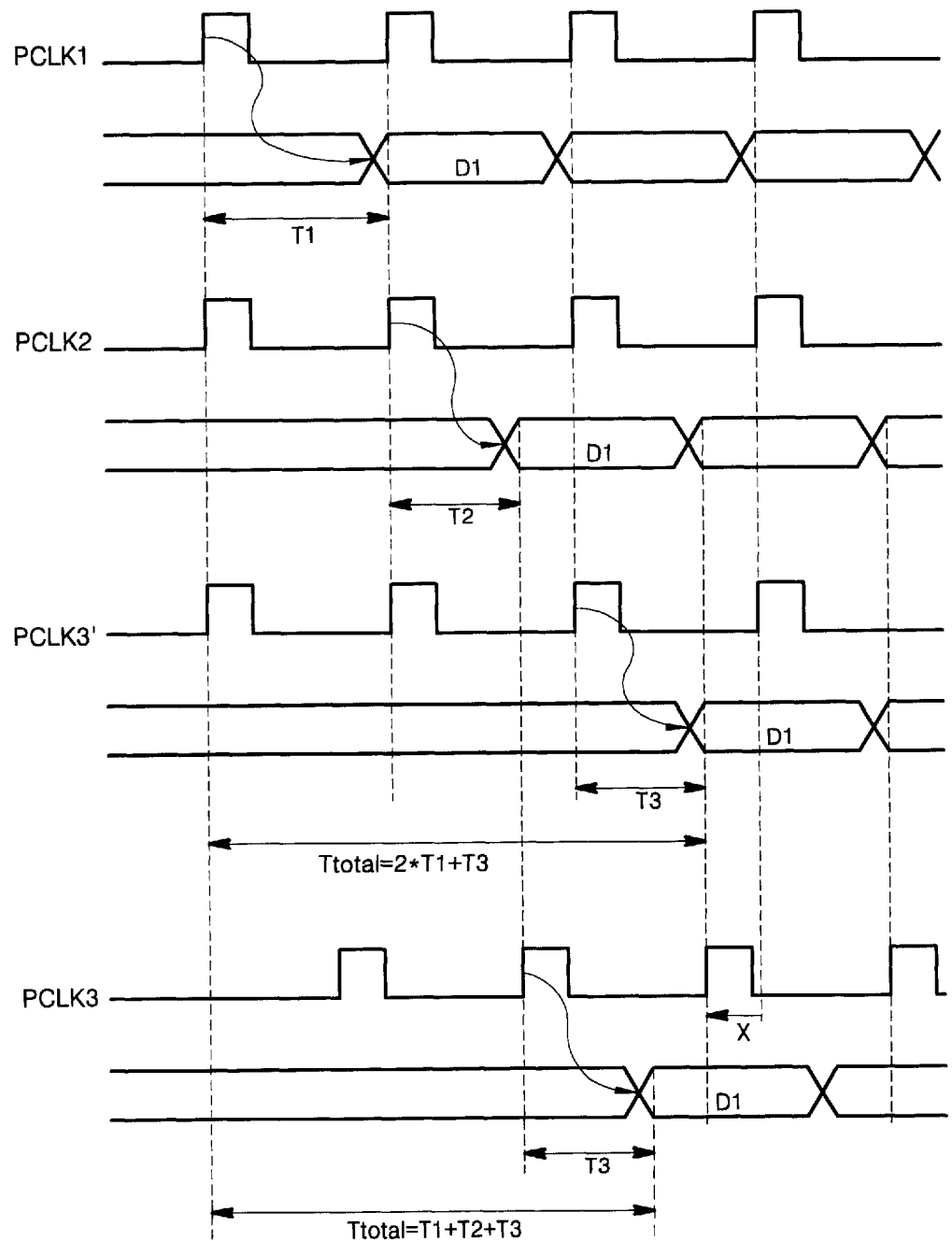
FIG. 3 is a timing diagram illustrating operation of the pipeline device of FIG. 1 when the stages have different transmission times.

FIG. 3 illustrates the timing of clock signals PCLK1, PCLK2, and PCLK3 and the output data signals from the data paths 20, 30, and 40 when the transmission time T1 is longer than the transmission times T2 and T3 (T1>T2=T3). In the example of FIG. 3, the latency of the pipeline device depends on the pipeline control signals. With control signals PCLK1, PCLK2, and PCLK3, which are in phase, the latency is 2T1+T3. In particular, the clock signal PCLK2 starts a data value through the data path 30 after a time T1 required for the data path 20 to transmit the data value. The clock signal PCLK3', which is in phase with clock signals PCLK1 and PCLK2, starts a data value through data path 40 after a full period P (equal to time T1), and the earliest that data is valid at the output terminal 50 is a time T3 later. The transmission time of the data path 30 is T2, which is shorter than the period P of the clock signals, and data is valid at the input latch of the register 42 before the rising edge of the third clock signal PCLK3'.

The clock signal PCLK3 has a phase that leads clock signal PCL3' by a time x in order to enable an output latch after the time of T2. Accordingly, with clock signals PCLK1, PCLK2, and PCLK3 of FIG. 3, the latency of the pipeline device is T1+T2+T3, which is the sum of the transmission times of the data paths 20, 30, and 40. Thus, controlling the pipe register 42 with the clock signal PCLK3 reduces the latency of the pipeline device.

Figure 4:
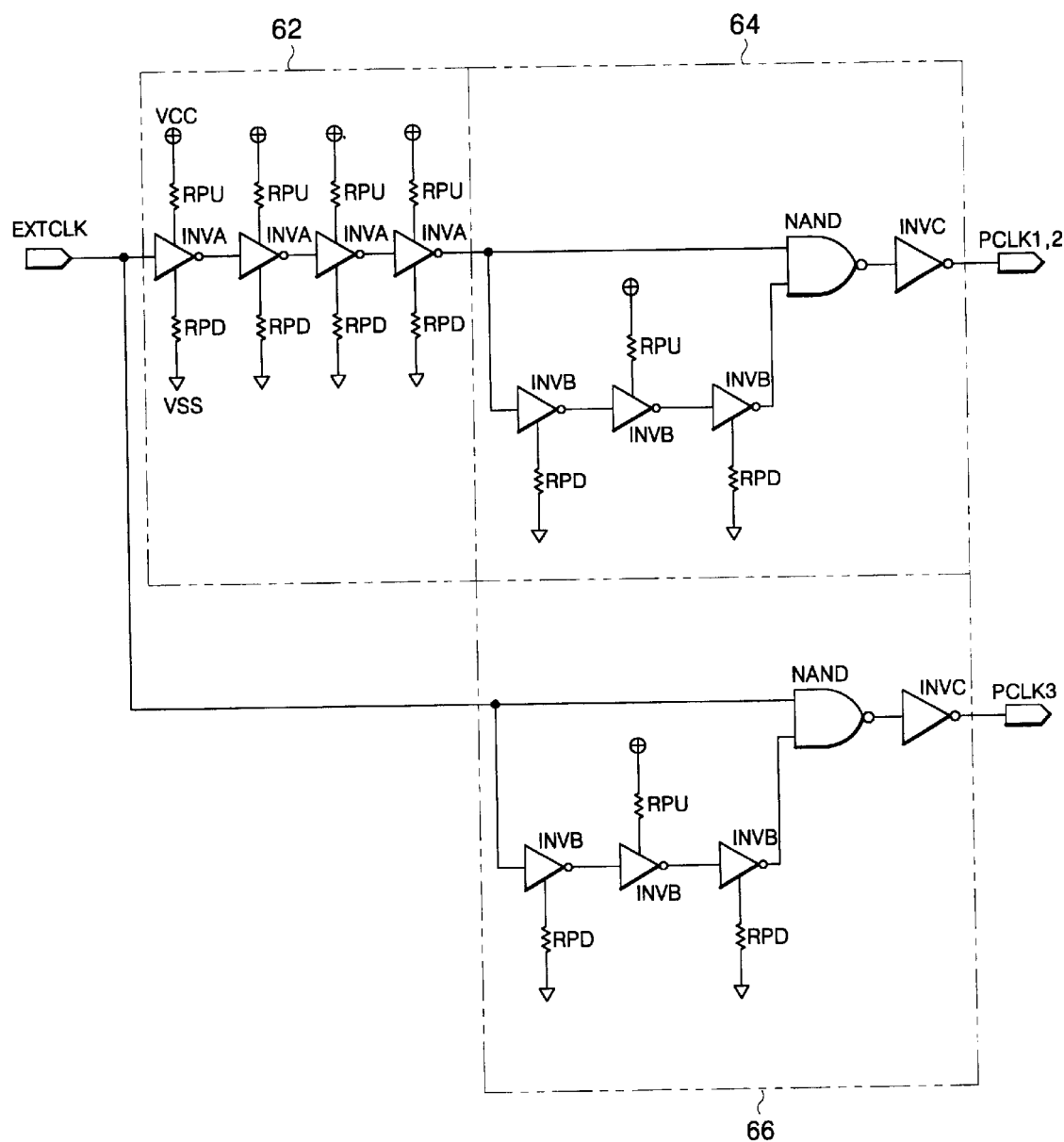
FIG. 4 is a circuit diagram illustrating a control signal generating circuit that produces pipeline control signals directly from a reference clock signal.

FIG. 4 is a circuit diagram of an embodiment of the control signal generating circuit 60 of FIG. 1. In FIG. 4, the control signal generating circuit 60 includes a delay circuit 62, a first pulse generator 64, and a second pulse generator 66.

The delay circuit 62 includes four inverters INVA connected in cascade. Each inverter INVA has a power supply terminal connected to a power supply voltage VCC via a pull-up resistor RPU, and a ground terminal connected to a ground voltage VSS via a pull-down resistor RPD. The delay circuit 62 has a delay time X.

The pulse generators 64 and 66 are substantially identical and provide a delay time da. Each of the pulse generators 64 and 66 includes three inverters INVB connected in cascade and AND logic including a NAND gate NAND1 and an inverter INVC. In response to rising edges of respective input signals, the pulse generators produce signals having pulses with a pulse width equal to a delay time of the three inverters INVB connected in cascade.

Figure 5:
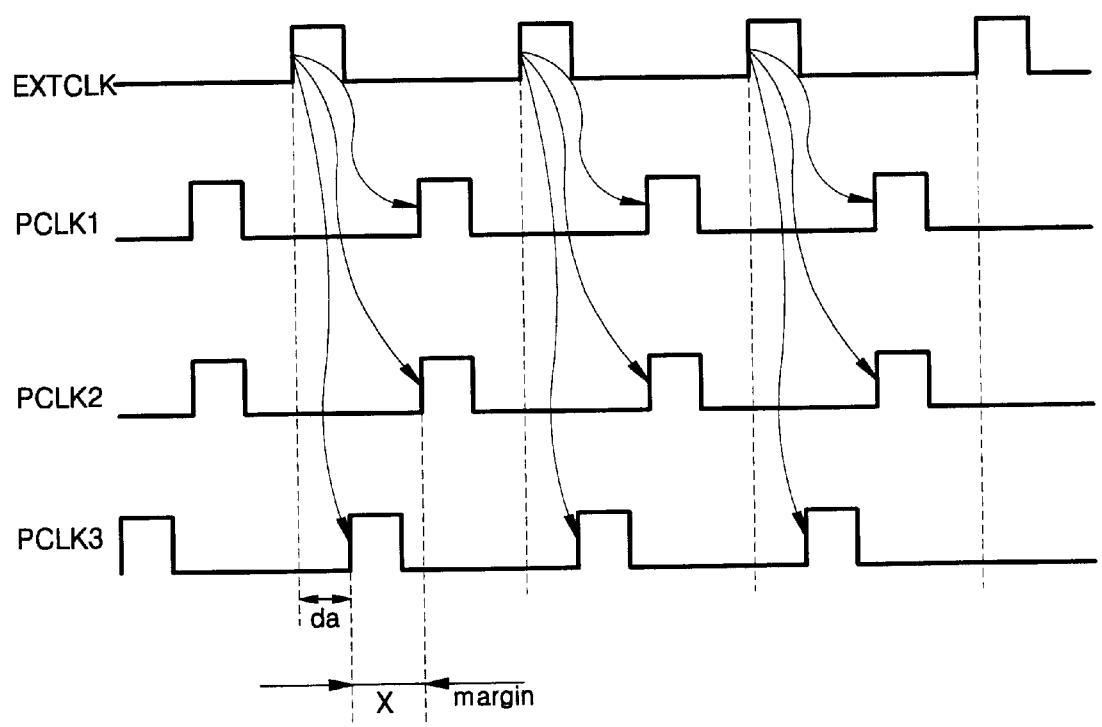
FIG. 5 is a timing diagram illustrating operation of the control signal generating circuit of FIG. 4.

FIG. 5 illustrates operation of the control signal generating circuit 60 of FIG. 4. In particular, the delay circuit 62 receives and delays an external reference clock signal EXTCLK by the delay time X. The pulse generator 64 receives the delayed reference clock signal EXTCLK and produces pulses in pipeline control signals PCLK1 and PCLK2. The pulses are synchronous with but delayed by a time x+da relative to the rising edges of the reference clock signal EXTCLK.

The pulse generator 66 receives the external reference clock signal EXTCLK and generates pipeline control signal PCLK3 from the reference clock signal EXTCLK. Pulses in the clock signal PCLK3 are delayed by time da from rising edges of the reference clock signal EXTCLK. Accordingly, the phase of the pipeline control signal PCLK3 leads pipeline control signals PCLK1 and PCLK2 by the delay time X, since the control signal PCLK3 does not pass through the delay circuit 62. (Alternatively, pipeline control signals PCLK1 and PCLK2 lead the control signal PCLK3 by time P−X, where the period P of the reference clock EXT is about equal to the longest transmission time T1.

For proper operation of the pipeline device according to the timing of FIGS. 3 and 5, the time P−X must be at least the transmission time T2. However, the delays X and da are subject to variations due, for example, to difference in the operating temperature, the supply voltage, and structures in generators 64 and 66. In particular, the margin built into the delay X to ensure that P−X is at least as long as transmission time T2 must account for difference between pulse generators 64 and 66. Accordingly, the margin required in the delay time X increases the latency of the pipeline device.

Figure 6:
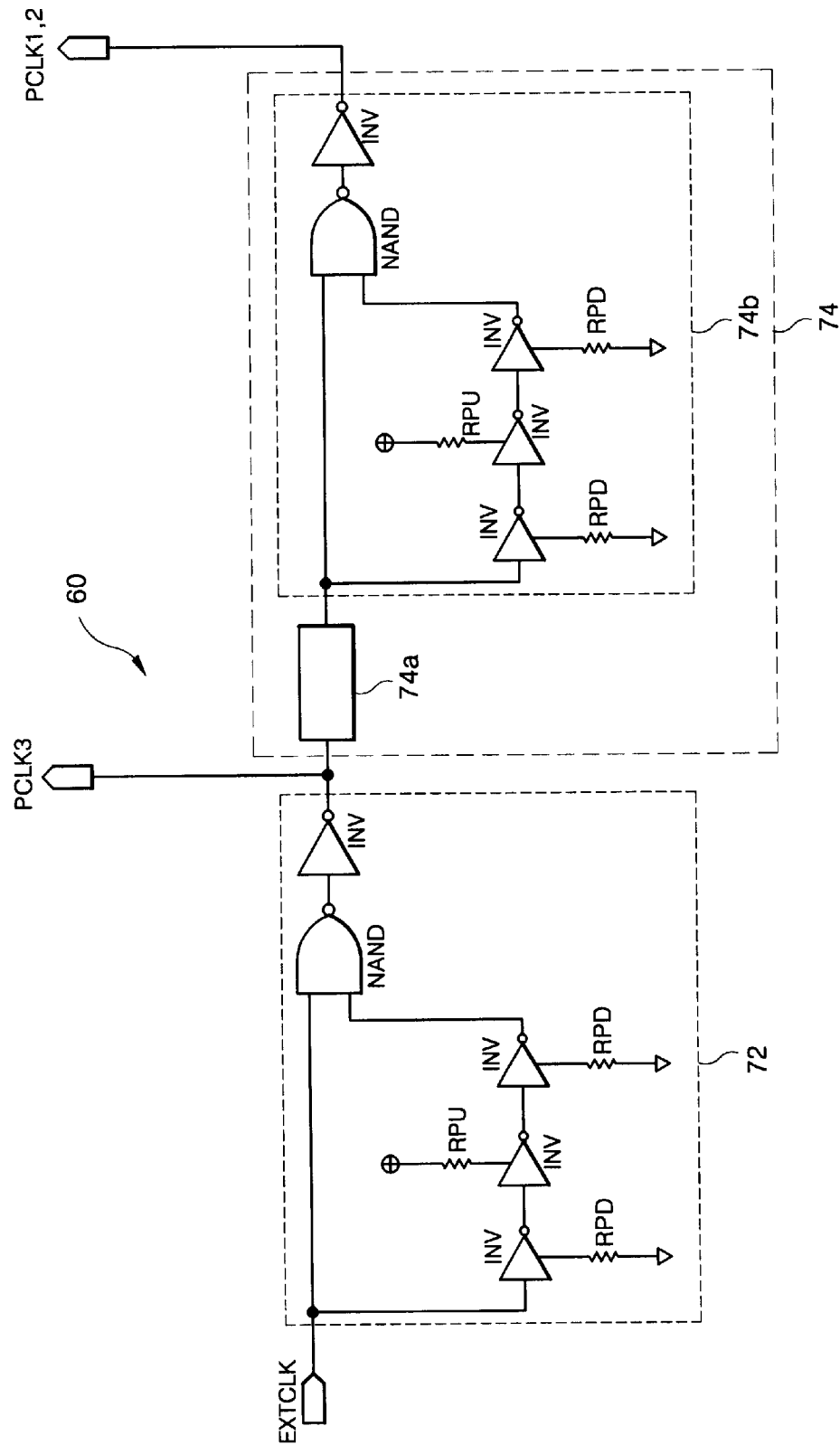
FIG. 6 is a circuit diagram illustrating a control signal generating circuit according to one embodiment of the present invention.

FIG. 6 is a circuit diagram of another embodiment of the control signal generating circuit 60. The embodiment of FIG. 6 includes a first pulse generating circuit 72 and a second pulse generating circuit 74.

Figure 7:
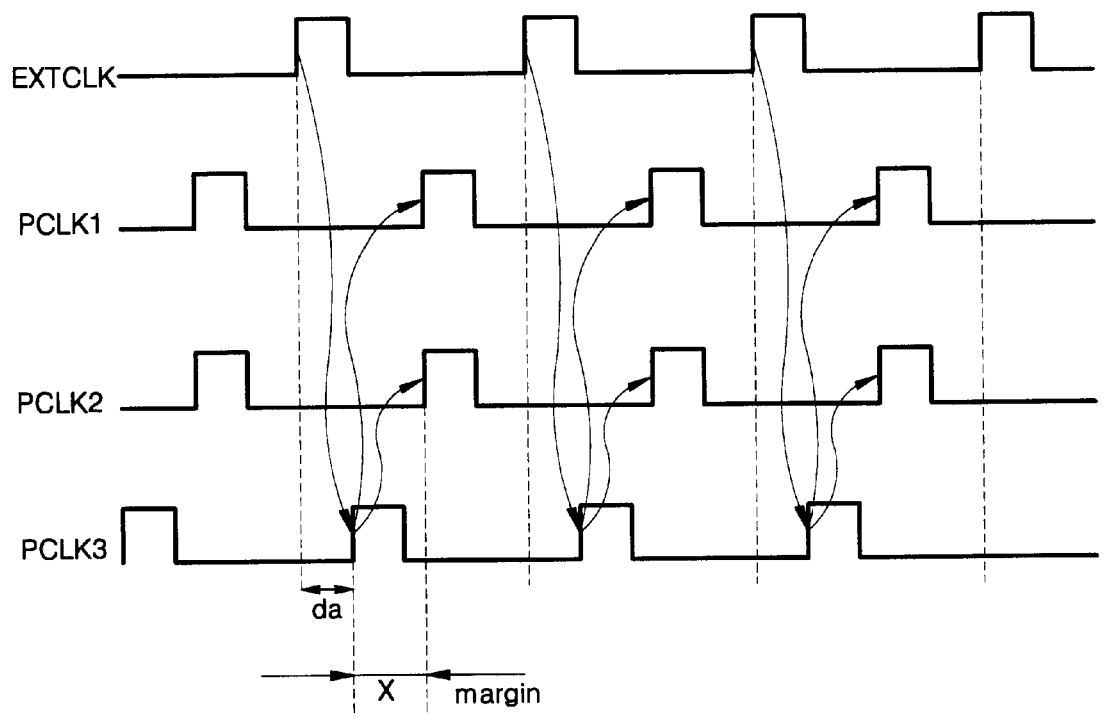
FIG. 7 is a timing diagram illustrating operation of the control signal generating circuit of FIG. 6.

The first pulse generating circuit 72 is a pulse generator that receives the external clock signal EXTCLK and produces the clock signal PCLK3 of FIG. 7. As shown in FIG. 7, the clock signal PCLK3 from the pulse generating circuit 72 includes pulses of a predetermined pulse width that are synchronized but delayed by a time da relative to leading edges of the reference clock signal EXTCLK.

The second pulse generating circuit 74 includes a delay circuit 74a and a pulse generator 74b. The delay 74a receives the clock signal PCLK3 and delays the signal PCLK3 by a delay time X−da, where da is the delay time of the pulse generator 74b. The pulse generator 74b produces the clock signals PCLK1 and PCLK2 of FIG. 7, which include pulses synchronous with but delayed by the time X relative to leading edges of pulses in the delayed clock signal PCLK3. Accordingly, the clock signal PCLK3 leads the clock signals PCLK1 and PCLK2 by the delay time X. Alternatively, the clock signals PCLK1 and PCLK2 lead the clock signal PCLK3 by the time P−X.

According to an aspect of the present invention, the time P−X available for transmission of data through data path 30 is independent of differences between pulse generators 72 and 74b. Accordingly, the margin built into the delay X to account for variations in temperature, power supply voltage, and structure can be reduced. Thus, the delay X can be maximized so that the time P−X is the shortest time to output the earliest valid data to the output terminal 50.

The above describes a three-stage pipeline device, but embodiments of the invention are not limited to three-stage devices. In one embodiment of the invention, an n-stage control signal generating circuit includes an (n)th stage and a plurality of stages connected in cascade in descending order from the (n)th stage. The (n)th stage includes a pulse generator that receives the reference clock signal and produces an (n)th pipeline control signals that is delayed by a delay time dn relative to the reference clock signal. Each of the other stages includes a delay circuit and a pulse generator. The (i−1)th stage receives the (i)th pipeline control signal from the (i)th stage and generates the (i−1)th pipeline control signal by delaying the (i)th control signal.

The delay time dn of the (n)th pipeline control signal is determined from a general formula below.

$$d_n = d_1 + \sum_{i=1}^{n-1} Ti - (n-1)P$$

Wherein, dn is a delay time from the reference clock signal of a first pipeline control signal, P is the period of the reference clock signal, and Ti are the transmission times of the n stages of the pipeline device.

Figure 8:
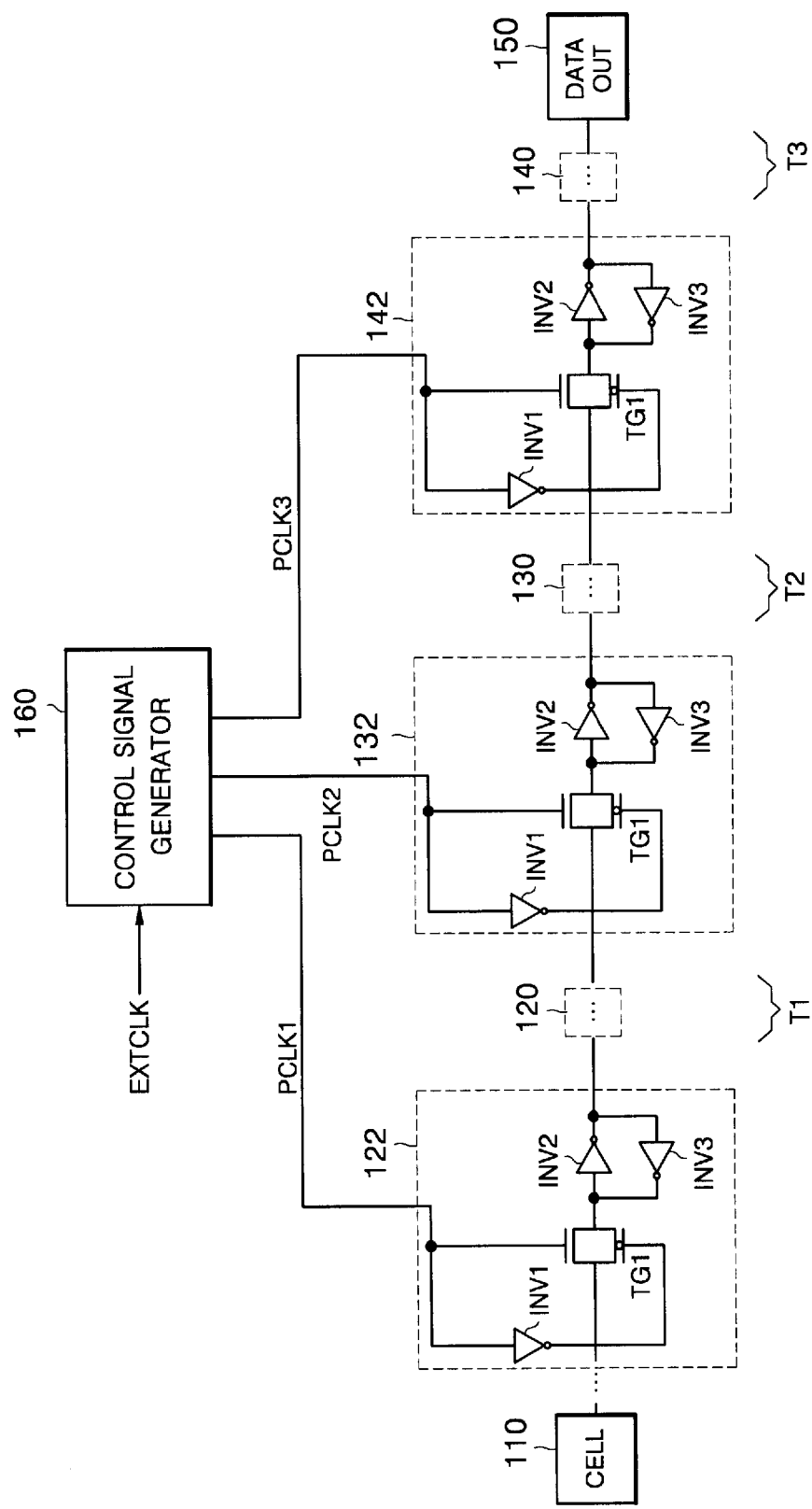
FIG. 8 is a block diagram illustrating a three-stage pipeline device including pipe registers containing input latches.

FIG. 8 another embodiment of a pipeline device having a data path divided into three stages between an input terminal and an output terminal 150. The data pipeline is in, for example, an SDRAM, and a memory cell 110 provides a data signal to the input terminal when read. The data paths 120, 130, and 140 have transmission times T1, T2, and T3 that differ from each other. Pipe registers 122, 132, and 142 are at input portions of the data paths 120, 130, and 140, respectively. In the embodiment of FIG. 8, the pipe registers 122, 132, and 142 are latches. Each of the latches includes inverters INV1 to INV3 and a transfer gate TG1.

The pipe registers 122, 132, and 142 receive respective pipeline control signals PCLK1, PCLK2, and PCLK3 from the control signal generating circuit 160.

Figure 9:
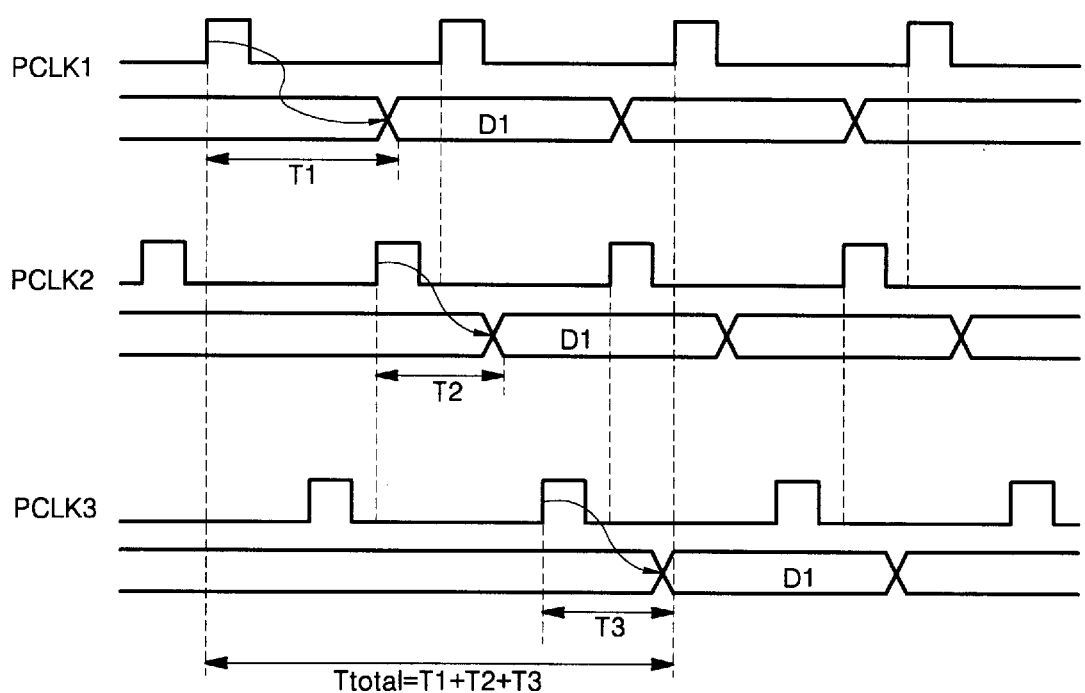
FIG. 9 is a timing diagram illustrating operation of the pipeline device of FIG. 8 when each stage has a different transmission time.

As shown in FIG. 9, a first rising edge of the clock signal PCLK1 turns on a transfer gate TG1 in the first pipe register 122, and the first pipe register 122 is transparent while the clock signal PCLK1 remains in the logic high state. At the trailing edges of the clock signal PCLK1, the transfer gate TG1 shuts off, and the first pipe register 122 latches and holds a data value D1. The first data path 120 transfers the data value D1, which becomes valid for the next stage 130 after the transmission time T1. The second pipe register 132 turns on a transfer gate TG1 at a rising edge of the clock signal PCLK2 before the data value D1 from the previous stage is valid. The second pipe register 132 transfers and latches the valid data value D1 after time T1 when a falling edge of the clock signal PCLK2 turns off the transfer gate TG2 in the second pipe register 132. A rising edge of the clock signal PCLK3 turns on a transfer gate TG1 in the third pipe register 142 at least a time T2 after the rising edge of the clock signal PCLK2. The time between the rising edges of the clock signal PCLK3 and the previous rising edge of the clock signal PCLK2 is greater than T2 by the amount that the rising edge of the clock signal PCLK2 precedes the end of the first transmission time T1. Accordingly, the data value D1 from the data path 130 is valid at the rising edge of the clock signal PCLK3. A falling edge of the clock signal PLCK3 turns off the transfer gate TG1 in the third pipe register 142 so that the third pipe register latches and holds the valid data value. The data signal from the data path 140 becomes valid after the transmission time T3.

The whole transmission time is T1+T2+T3. Accordingly, the data can be outputted within the shortest possible time by controlling the first to third pipe registers 122, 132, and 142 with the clock signals PCLK1, PCLK2, and PCLK3 having a phase different each other.

Figure 10:
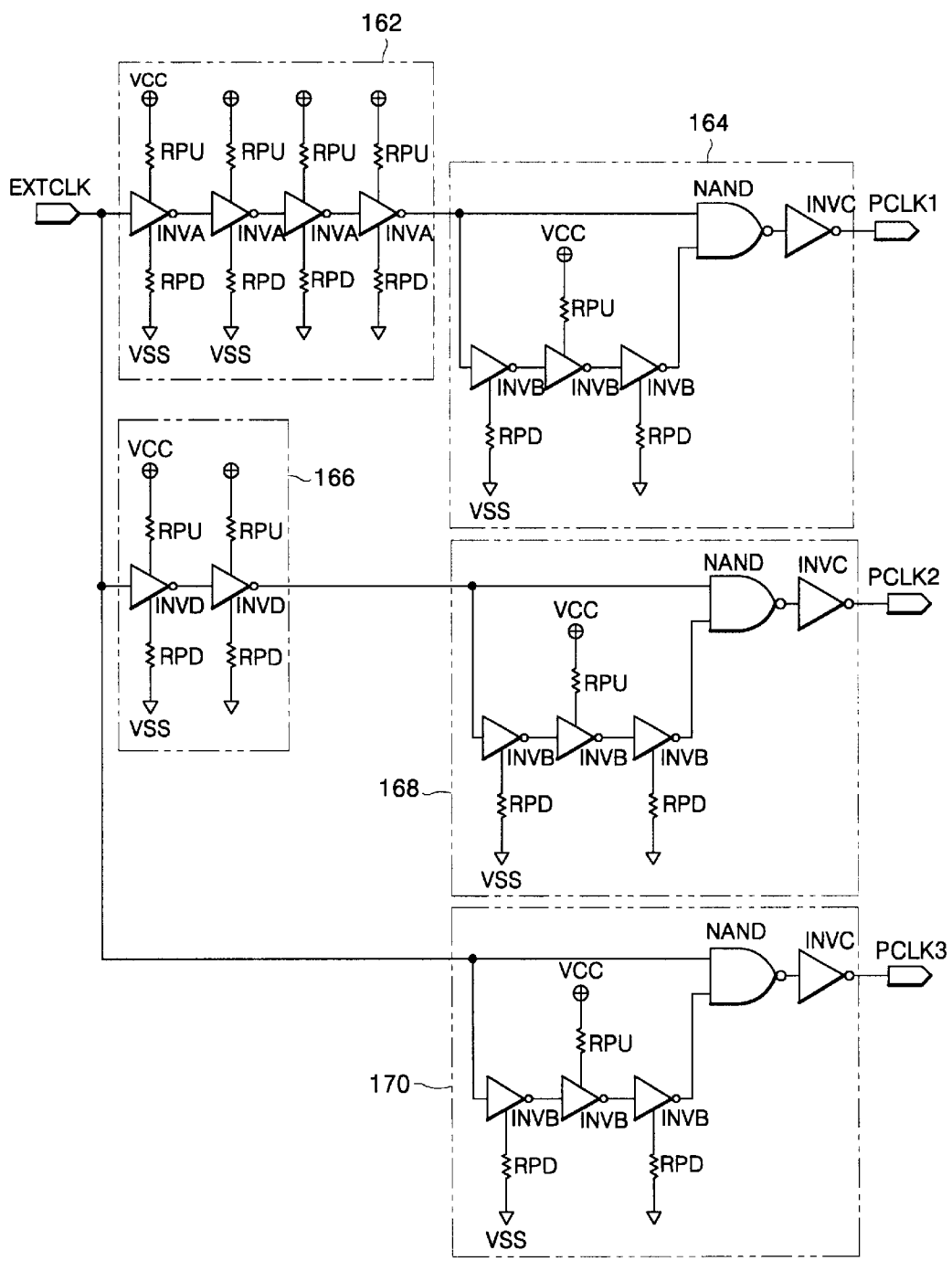
FIG. 10 is a circuit diagram of an embodiment of the control signal generating circuit of FIG. 8.

FIG. 10 shows an embodiment of the control signal generating circuit 160 that includes a delay circuit 162, a first pulse generator 164, a delay circuit 166, a second pulse generator 168 and a third pulse generator 170.

The delay circuit 162 includes four inverters INVA connected in cascade. Each inverter INVA has a power supply terminal connects to a power supply voltage via a pull-up resistor RPU and a ground terminal connects to a ground voltage VSS via a pull-down resistor RPD. The delay circuit 162 has a delay time X+Y. The delay circuit 166 comprises two inverters INVD having the same configuration as inverters INVA of the delay circuit 162. The delay circuit 166 has a delay time X.

Each of the pulse generators 164, 168, and 170 includes three inverters INVB connected in cascade and AND logic including a NAND gate and an inverter INVC. Each of the pulse generators 164, 168 and 170 has the same delay time da. In response to a rising edge of an associated input signal, each pulse generator 164, 168, or 170 produces a pulse or active region in the associated clock PLCK1, PLCK2, or PLCK3 having a pulse width equal to a delay time of the three inverters INVB connected in cascade.

The clock signal PLCK2 leads the clock signal PLCK1 by the time Y, and the clock signal PLCK3 leads the clock signal PLCK2 by the time X.

Figure 11:
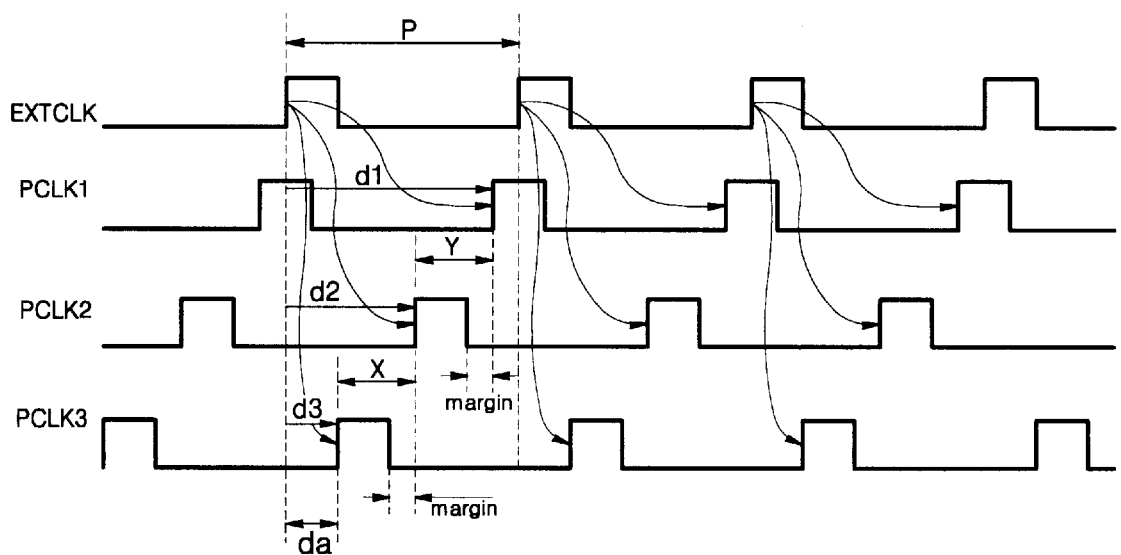
FIG. 11 is a timing diagram illustrating operation of the control signal generating circuit of FIG. 8.

In FIG. 11, the delay circuit 162 delays the inputted external clock signal, that is the reference clock signal EXTCLK by time X+Y and then provides the delayed reference clock signal to the pulse generator 164. The pulse generator 164 produces a pulse in the clock signal PCLK1 after a further delay da synchronously with a rising edge of the signal from the delay circuit 162. Thus, rising edges of the clock signal PCLK1 are delayed by x+y+da relative to rising edges of the reference clock signal EXTCLK.

The delay circuit 166 delays an inputted external clock signal, that is the reference clock signal EXTCLK by the time X and then provides the delayed reference clock signal to the pulse generator 164. The pulse generator 164 produces a rising edge in the clock signal PCLK2 that is further delayed by a time da relative to a rising edge of the reference clock signal EXTCLK. Thus, the clock signal PCLK2 has rising edges delayed by the time x+da relative to rising edges in the inputted pulse signal.

The pulse generator 170 produces rising edges in the clock signal PCLK3 that are delayed by the time da relative to rising edges of the inputted external clock signal EXT-CLK.

Accordingly, the control signal generating circuit 160 produces each control signal that is, the clock signals PCLK1, PCLK2 and PCLK3 directly from an external clock signal EXTCLK, respectively. Accordingly, the timing relationships among the clock signals PCLK1, PCLK2, and PCLK2 are independent of each other, and subject to variations due to differences in elements 162, 164, 166, 168, and 170. The independent timing relationships require large margins in consideration of changes in temperature and power supply, and the required margins make the whole transmission time becomes longer. This delays the output time of the data.

Figure 12:
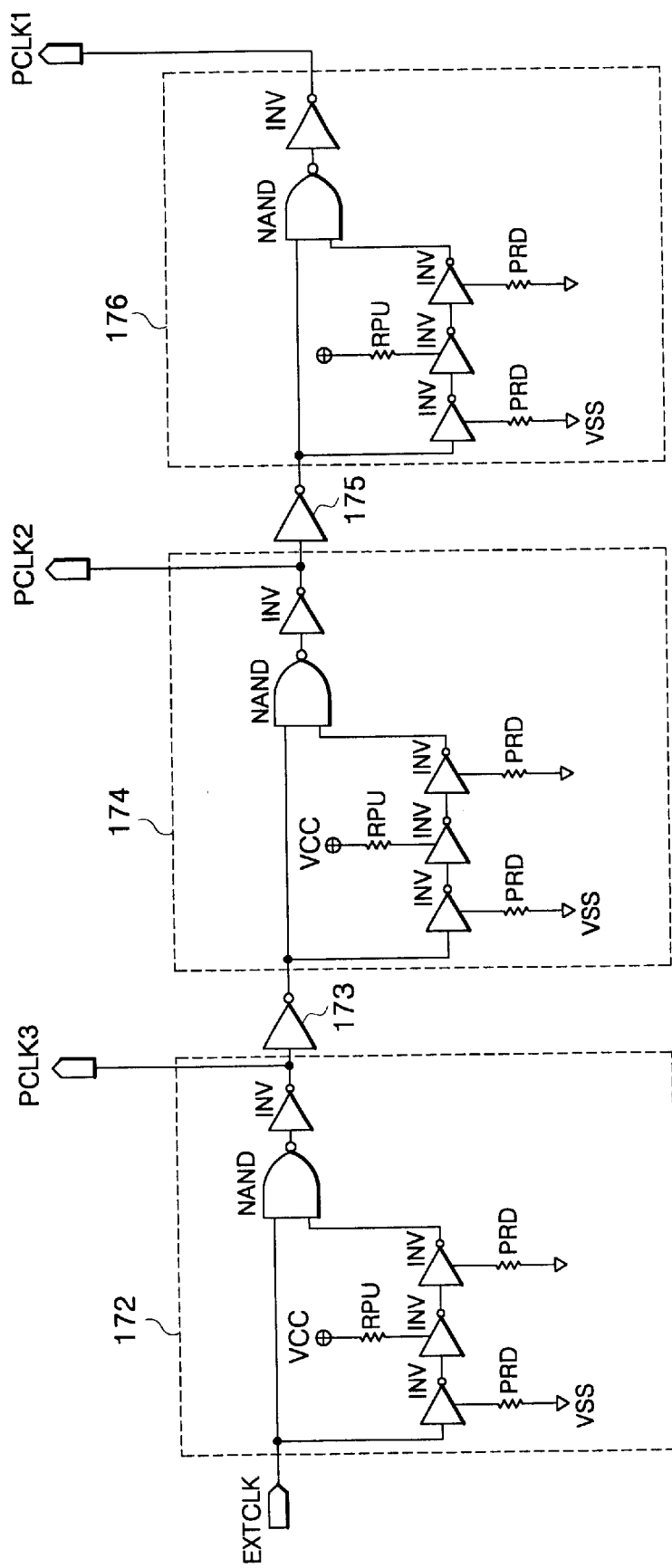
FIG. 12 is a circuit diagram illustrating another embodiment of the control signal generating circuit shown in FIG. 8.
Figure 13:
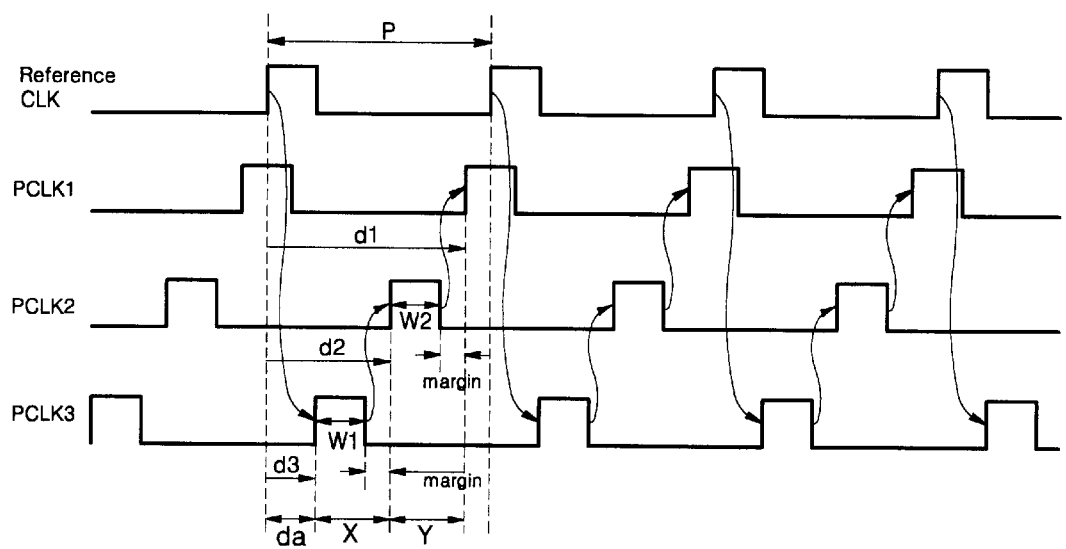
FIG. 13 is a timing diagram illustrating operation of the control signal generating circuit of FIG. 12.

FIG. 12 shows an embodiment of the control signal generating circuit 160 that includes pulse generating circuit 172, 174, and 176. FIG. 13 shows the relative timing of clock signals PCLK1, PCLK2, and PCLK3 output from the control signal generating circuit 160 of FIG. 12.

In FIG. 12, each of the pulse generating circuits 172, 174, and 176 includes three inverters INV connected in cascade and AND logic including a NAND gate and an inverter INV). Each of the generating circuits 172, 174, and 176 provides an identical delay time da. The pulse generating circuit 172 has a pulse width of w1, and the pulse generating circuit 174 has a pulse width of w2. The pulse widths w1 and w2 depend on the delays of the respective sets of three inverters connected in cascade.

An inverter 173 is between the pulse generating circuit 172 and the pulse generating circuit 174. An inverter 175 is between the pulse generating circuit 174 and the pulse generating circuit 176.

The pulse generating circuit 172 receives an external clock signal EXTCLK and generates a clock signal PCLK3, having active regions with the pulse width w1 and delayed by the time da relative to the external clock signal. The clock signal PCLK3 is delayed by a time d3, that is da relative to the external clock signal EXTCLK.

The pulse generating circuit 174 receives from the inverter 173 an inverted version of the clock signal PCLK3 and produces a clock signal PCLK2. The pulse generating circuit 174 delays active regions of the clock signal PCLK2 relative to the active regions of the clock signal PCLK3. In particular, each rising edge of the clock signal PCLK2 is synchronized with but delayed by time da relative to a falling edge of the clock signal PCLK3. Thus, the clock signal PCLK2 is delayed by time X (or w1+da) relative to the clock signal PCLK3. The delay d2 of clock signal PCLK2 relative to the reference clock signal EXTCLK is equal to 2da+w1.

The pulse generating circuit 176 receives from the inverter 175 an inverted version of the clock signal PCLK2 and from the inverted signal produces the clock signal PCLK1. Active regions of the clock signal PCLK1 are delayed relative to the active regions of the clock signal PCLK2. In particular, each rising edge of the clock signal PCLK1 is synchronized with but delayed by time da relative to a falling edge of the clock signal PCLK2. Thus, the clock signal PCLK1 is delayed by time Y (or w2+da) relative to the clock signal PCLK2. The clock signal PCLK1 is delayed by time X+Y (or w1+w2+2*da) relative to the clock signal PCLK3, and the delay d1 of clock signal PCLK1 relative to the reference clock signal EXTCLK is equal to 2da+w1+w2.

The control signal generating circuit 160 of FIG. 12 generates signal PCLK2 from signal PCLK3 and signal PCLK1 from signal PCLK2. Accordingly, signals PCLK1 and PCLK2 automatically compensate for variations in signal PCLK3 that variations in temperature or power supply voltage may cause. Similarly, signal PCLK1 automatically compensate for variations in signal PCLK2. As in the previously described embodiment of the present invention, generating pipeline control signals in cascade can maximize the delays X and Y. The circuitry configuration can be simplified by setting a phase angle in consideration of a delay time of a delay circuit.

As shown above, a multi-stage pipeline device generates pipeline control signals from the reference clock signal in each stage in a descending series and in cascade so that the phase angle of each stage can be maximized. This permits the earliest data to be outputted within the shortest time. Accordingly, a memory device can be operated at a high speed.

Although the invention has been described with reference to particular embodiments, the description is only an example of the invention's application and should not be taken as a limitation. Various adaptations, omissions, and combinations of features of the embodiments disclosed are within the scope of the invention as defined by the following claims.

What is claimed is:

1. A pipeline device comprising:

n data path circuits connected in cascade between an input terminal and an output terminal, said n data path circuits having transmission times (T1, . . . , Tn), wherein each transmission time is less than or equal to a period P of a reference clock signal, and at least one of said transmission times differs from another of said transmission times;

n registers disposed at respective input terminals of said n data path circuits, wherein each register latches data passed to a corresponding one of said data path circuits; and a control signal generating circuit that in response to said reference clock signal, produces n pipeline control signals respectively for said n registers, said control generating circuit producing at least one of said pipeline control signals by delaying another of said n pipeline control signals, said delayed pipeline control signal corresponding to a register of a subsequent one of said n data path circuits relative to the produced pipeline control signal.

2. The pipeline device as claimed in claim 1, wherein said control signal generating circuit includes:

a first stage including a first pulse generator that inputs said reference clock signal and produces an (n)th pipeline control signal having pulses delayed by a delay time $d_n$ relative to transitions in said reference clock signal; and a second stage connected to receive said (n)th pipeline control signal from said first stage, said second stage including a second pulse generator that produces a (n−1)th pipeline control signal delayed by a delay time $(d_{n-1}-d_n)$ relative to said (n)th pipeline control signal, wherein $d_{n-1}$ is a delay time of the (n−1)th pipeline control signal relative to transitions in said reference.

3. The pipeline device as claimed in claim 2, wherein said control signal generating circuit further includes n−2 stages connected in series with said first and second stages, wherein for i between n−2 and 1, an (i)th stage receives an (i+1)th pipeline control signal from a preceding stage and generating an (i)th pipeline control signal by delaying said (i+1)th pipeline control signal.

4. The pipeline device as claimed in claim 3, wherein said delay time dn is related to said transmission time as:

$$d_n = d_1 + \sum_{i=1}^{n-1} Ti - (n-1)P$$

wherein d1 is a delay time from a reference clock signal of a first pipeline control signal, P is a period of said reference clock signal, and Ti is the transmission time of the (i)th stage of the pipeline device.

5. The pipeline device as claimed in claim 2, wherein said first pulse generator includes:

a delay circuit that delays said reference clock signal for a predetermined time; and logic that inputs and combines said reference clock signal and a delayed signal from said delay circuit.

6. The pipeline device as claimed in claim 2, wherein said second pulse generator comprises:

a first delay circuit that inputs and delays said (n)th pipeline control signal;

a second delay circuit that inputs and delays a signal from said first delay circuit; and logic that inputs and combines said signal from said first delay circuit and a signal from said second delay circuit.

7. The pipeline device as claimed in claim 1, wherein said control signal generating circuit includes:

a first stage including a first pulse generator that inputs said reference clock signal and produces an (n)th pipeline control signal having pulses with a pulse width w1; and a second stage including a second pulse generator that produces a second pipeline control signal having pulses with a pulse width of w2 in response to trailing edges of said pulses in said (n)th pipeline control signal.

8. A method for generating control signals of a pipeline device, comprising:

generating an (n)th pipeline control signal in response to a reference clock signal;

generating n−1 pipeline control signals in cascade from preceding pipeline control signals; and providing n pipe registers with said n pipeline control signals.

9. A method for generating control signals of a pipeline device, comprising:

generating an (n)th pipeline control signal having a pulse width of wn in response to a reference clock signal;

generating n−1 pipeline control signals in cascade from preceding pipeline control signals, wherein for i between n−1 and 1, an (i)th pipeline control signal has active regions of a pulse width w(i) generated in response to trailing edges of active regions of an (i+1)th pipeline control signal; and providing n pipe registers with said n pipeline control signals.

10. A pipeline device comprising:

n data path circuits connected in cascade between an input terminal and an output terminal, said n data path circuits having transmission times (T1, . . . , Tn), wherein each transmission time is less than or equal to a period P of a reference clock signal, and at least one of said transmission times differs from another of said transmission times;

n registers disposed at respective input terminals of said n data path circuits, wherein each register latches data passed to a corresponding one of said data path circuits; and a control signal generating circuit that produces a pipeline control signal for each of said n registers by delaying said reference clock signal by a respective delay time, the delay time of the pipeline control signal for at least one of said n registers being less than the delay time of the pipeline control signal for another of said n registers in a preceding data path circuit.

11. The pipeline device as claimed in claim 10, wherein said control signal generating circuit includes, a first stage including a first pulse generator that inputs said reference clock signal and produces an (n)th pipeline control signal having pulses delayed by a delay time $d_n$ relative to transitions in said reference clock signal; and a second stage that produces an (n−1)th pipeline control signal by delaying said reference clock signal by a delay time $d_{n-1}$, the second stage including, a first delay circuit that inputs said reference clock signal and produces pulses delayed by a delay time $(d_{n-1}-d_n)$ relative to transitions in said reference clock signal, and a second pulse generator connected to receive the pulses produced by said first delay circuit, the second pulse generator producing said (n−1)th pipeline control signal by delaying said received pulses by a delay time substantially equal to the delay time $d_n$.

12. The pipeline device as claimed in claim 11, wherein said control signal generating circuit further includes n−2 stages, wherein for each i between n−2 and 1, an (i)th stage that produces an (i)th pipeline control signal by delaying said reference clock signal by a delay time $d_i$, the (i)th stage including, an (i+1)th delay circuit that inputs said reference clock signal and produces pulses delayed by a delay time $(d_i-d_n)$ relative to transitions in said reference clock signal, and an (i)th pulse generator connected to receive the pulses produced by said (i+1)th delay circuit, the second pulse generator producing said (i)th pipeline control signal by delaying said received pulses by a delay time substantially equal to the delay time $d_n$.

13. The pipeline device as claimed in claim 12, wherein said delay time dn is related to said transmission time as:

$$d_n = d_1 + \sum_{i=1}^{n-1} Ti - (n-1)P$$

wherein $d_1$ is a delay time from a reference clock signal of a first pipeline control signal, P is a period of said reference clock signal, and $T_i$ is the transmission time of the (i)th stage of the pipeline device.

* * * * *